United States Patent
Nakao et al.

(10) Patent No.: US 7,345,400 B2
(45) Date of Patent: Mar. 18, 2008

(54) SURFACE ACOUSTIC WAVE DEVICE

(75) Inventors: Takeshi Nakao, Nagaokakyo (JP);
Masakazu Mimura, Nagaokakyo (JP);
Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/674,816

(22) Filed: Feb. 14, 2007

(65) Prior Publication Data

US 2007/0132338 A1    Jun. 14, 2007

Related U.S. Application Data

(62) Division of application No. 10/755,355, filed on Jan. 13, 2004, now Pat. No. 7,209,018.

(30) Foreign Application Priority Data

Jan. 27, 2003 (JP) ............... 2003-017648
Dec. 10, 2003 (JP) ............... 2003-411815

(51) Int. Cl.
*H03H 9/64* (2006.01)
*H03H 3/10* (2006.01)
*H03H 9/25* (2006.01)

(52) U.S. Cl. .............. 310/313 A; 310/313 R; 310/340; 333/195

(58) Field of Classification Search ........... 310/313 A, 310/313 R, 340; 333/186, 193–196
See application file for complete search history.

(56) References Cited

U.S. PATENT DOCUMENTS

| | | | |
|---|---|---|---|
| 4,489,250 A * | 12/1984 | Ebata et al. ............ 310/313 A |
| 4,544,857 A | 10/1985 | Shimizu et al. | |
| 4,978,879 A | 12/1990 | Satoh et al. | |
| 5,215,546 A * | 6/1993 | Cho et al. ............... 29/25.01 |
| 5,814,917 A | 9/1998 | Isobe et al. | |
| 5,838,089 A * | 11/1998 | Dreifus et al. .......... 310/313 A |
| 5,923,231 A | 7/1999 | Ohkubo et al. | |
| 5,998,907 A | 12/1999 | Taguchi et al. | |
| 6,037,847 A | 3/2000 | Ueda et al. | |
| 6,317,014 B1 | 11/2001 | Kadota | |

(Continued)

FOREIGN PATENT DOCUMENTS

EP    0 734 120 A1    9/1996

(Continued)

OTHER PUBLICATIONS

H. Shimizu et al.; "Love-Type-SAW Resonator of Small Size With Very Low Capacitance Ration and its Application to VCO"; 1990-IEEE Ultrasonics Symposium Proceedings; vol. 1, pp. 103-108; Dec. 1990.

(Continued)

*Primary Examiner*—Thomas M. Dougherty
(74) *Attorney, Agent, or Firm*—Keating & Bennett, LLP

(57) ABSTRACT

In a surface acoustic wave device, electrode films constituting at least one IDT are disposed on a piezoelectric substrate, and an $SiO_2$ film is arranged on the piezoelectric substrate so as to cover the electrode films. The film-thickness of the electrode films is in the range of about 1% to about 3% of the wavelength of an excited surface acoustic wave.

9 Claims, 14 Drawing Sheets

U.S. PATENT DOCUMENTS

| | | |
|---|---|---|
| 6,317,015 B1 | 11/2001 | Ueda et al. |
| 6,346,761 B1 | 2/2002 | Isobe et al. |
| 6,717,487 B2 | 4/2004 | Takata |
| 7,109,828 B2 * | 9/2006 | Takayama et al. .......... 333/193 |
| 7,224,101 B2 * | 5/2007 | Mishima et al. ......... 310/313 A |
| 2006/0273687 A1 * | 12/2006 | Fujimoto et al. ....... 310/313 R |

FOREIGN PATENT DOCUMENTS

| | | |
|---|---|---|
| JP | 54-158895 A | 12/1979 |
| JP | 61-199315 A | 9/1986 |
| JP | 63-260213 A | 10/1988 |
| JP | 02-037815 | 2/1990 |
| JP | 2-295212 A | 12/1990 |
| JP | 5-259802 | 10/1993 |
| JP | 05-335879 | 12/1993 |
| JP | 7-254835 A | 10/1995 |
| JP | 08-265088 | 10/1996 |
| JP | 09-186542 | 7/1997 |
| JP | 2000-196400 A | 7/2000 |
| JP | 2003-198323 | 7/2003 |
| WO | 96/04713 | 2/1996 |

OTHER PUBLICATIONS

Official communication issued counterpart Japanese Application No. 2003-411815, mailed on Nov. 6, 2007.

* cited by examiner

ELECTRODE $\approx 2\%$

FIG. 14   Al - IDT HAVING THICKNESS CORRESPONDING TO AT LEAST 10% OF TOTAL THICKNESS
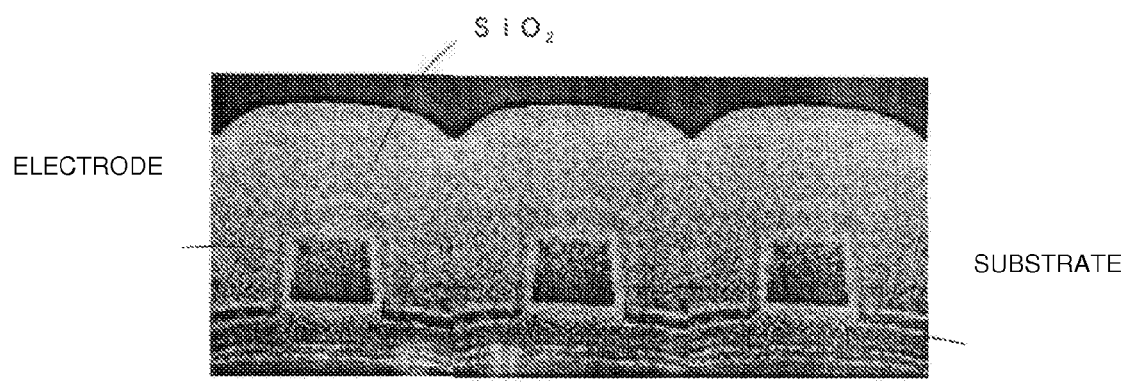

SURFACE ACOUSTIC WAVE DEVICE

BACKGROUND OF THE INVENTION

1. Field of the Invention

The present invention relates to a surface acoustic wave device and, in particular, to a surface acoustic wave device in which an insulating film is arranged to cover electrode films constituting at least an IDT (interdigital transducer).

2. Description of the Related Art

In known RF surface acoustic wave filters, $LiTaO_3$ substrates and $LiNbO_3$ substrates are used as piezoelectric substrates. To improve the frequency-temperature coefficients of the piezoelectric substrates, different structures have been proposed in which electrode films constituting IDTs are formed on piezoelectric substrates, and thereafter, $SiO_2$ films are formed on the piezoelectric substrates so as to cover the electrode films (e.g., Japanese Unexamined Patent Application Publication Nos. 2-37815 (Patent Document 1), 8-265088 (Patent Document 2), and 9-186542 (Patent Document 3), and WO96/4713 (Patent Document 4)).

The surface acoustic wave devices having SiO2 films formed therein to improve the frequency-temperature coefficients as described above have problems in that the characteristics are deteriorated since the upper surfaces of the SiO2 films have convex portions and concave portions.

On the other hand, in the case in which the upper surfaces of the SiO2 films are flattened as described in Patent Document 4, the reflection on electrode fingers or the like is reduced, so that the characteristics are improved to some degree. However, a process of flattening the upper surfaces of SiO2 films is required, or a step of forming an SiO2 film of which the upper surface is flat becomes necessary. Thus, the production method tends to become complicated.

SUMMARY OF THE INVENTION

In order to overcome the problems described above, preferred embodiments of the present invention provide a surface acoustic wave device having an insulating film arranged on a piezoelectric substrate so as to cover an electrode film, which has superior resonance characteristics, filter characteristics, and frequency-temperature coefficient, and which can be are formed by a simple process.

According to a preferred embodiment of the present invention, a surface acoustic wave device includes a piezoelectric substrate, electrode films disposed on the piezoelectric substrate and constituting at least one IDT, and a sputtered insulating film arranged on the piezoelectric substrate so as to cover the electrode films and the insulating film having convex portions and concave portions on the upper surface thereof, the film-thickness of the electrode films being in the range of about 1% to about 3% of the wavelength of an excited surface acoustic wave.

The insertion loss is reduced, and moreover, the filter characteristics and the resonance characteristics are superior, since the film-thickness of the electrode films is in the range of about 1% to about 3% of the wavelength of an excited surface acoustic wave. If the film-thickness exceeds about 3%, the insertion loss increases. If the film-thickness of the electrode films is less than about 1%, the conductor loss in the electrodes becomes large.

According to a preferred embodiment of the present invention, the insulating film has convex portions and concave portions on the upper surface thereof, That is, the convex portions and concave portions exist in which the portions of the insulating film positioned above the electrode films are convex compared to the other portions of the insulating film.

Preferably, the insulating film is made of SiO2. Thereby, the frequency-temperature coefficient TCF of the surface acoustic wave device is effectively improved.

Preferably, the film-thickness of the insulating film made of SiO2 is in the range of about 15% to about 40%, more preferably, at least about 30% of the wavelength of the surface acoustic wave. Thereby, the frequency-temperature coefficients TCF is reduced by at least about 50% compared to that of such a device in which no SiO2is formed.

Also, preferably, the piezoelectric substrate has a frequency-temperature coefficient TCF which is in the range of about −100 ppm/° C. to about −10 ppm/° C. Thus, the combination of the piezoelectric substrate with the insulating film such as the SiO2 film or other suitable film effectively improves the frequency-temperature coefficient TCF.

Preferably, the piezoelectric substrate is a rotation Y-cut X-propagation LiTaO3 substrate or a rotation Y-cut X-propagation LiNbO3 substrate. When the piezoelectric substrate is used, the frequency-temperature coefficient TCF is effectively improved while the resonance characteristics and the filter characteristics are scarcely deteriorated. Preferably, the piezoelectric substrate is a rotation Y-cut X-propagation LiTaO3 substrate or a rotation Y-cut X-propagation LiNbO3 substrate, which has a cut-angle in the range of about 0° to about 160°. Thereby, the frequency-temperature coefficient TCF is more effectively improved.

Preferably, the piezoelectric substrate is a rotation Y-cut X-propagation LiNbO3 substrate, and the surface acoustic wave is a Love wave which generates no attenuation. Thereby, the surface acoustic wave device has a small attenuation and superior characteristics.

Also, preferably, the surface acoustic wave device is provided with a reflector defined by the electrode films. Thus, the surface acoustic wave device may be a resonator, a resonator type filter or other suitable device which is provided with the reflector, or may be an end surface reflection type surface acoustic wave device which utilizes reflection on the two opposed end surfaces of a piezoelectric substrate.

In the surface acoustic wave device of various preferred embodiments of the present invention, the electrode films may be made of different metal materials. Preferably, the electrode films are made of Al or an Al alloy. Thereby, the reflection coefficient is enhanced, and a superior resonance characteristic is obtained.

Also, preferably, the electrode films are made of a metal or an alloy having a higher density than Al. Thus, even if the electrode film-thickness is reduced, a high electromechanical coupling coefficient can be obtained. Moreover, the reflection coefficient becomes large, and the number of electrode fingers of IDT can be reduced. Thus, the size of the surface acoustic wave resonator can be reduced. In addition, the surface acoustic wave device utilizing a Love wave can be easily produced.

Preferably, according to a preferred embodiment of the present invention, a one-port type surface acoustic wave resonator is provided. Also, preferably, a resonator type filter, a ladder type filter, or a lattice type filter may preferably be provided.

In the case in which the piezoelectric property is enhanced by formation of a piezoelectric film made of Ta2O5, ZnO or other suitable material, or the surface protecting function is enhanced by formation of the insulating film made of another insulating material, the characteristics of the surface acoustic wave device are prevented from being deteriorated. In addition, according to preferred embodiments of the present invention, the surface of the insulating film may have convexities and concavities, so that a complicated process is not required for the formation of the insulating film.

Other features, elements, characteristics, steps and advantages of the present invention will become more apparent from the following detailed description of preferred embodiments with reference to the attached drawings.

BRIEF DESCRIPTION OF THE DRAWINGS

FIG. 14 is an electron microscopic photograph showing a cross-section of a surface acoustic wave resonator in which IDTs made of Al and having a film-thickness of about 0.1λ is formed on a 36° Y-cut X-propagation LiTaO3 substrate, and an SiO2 film having a thickness of about 30% of the wavelength is formed thereon by CVD.

DETAILED DESCRIPTION OF PREFERRED EMBODIMENTS

Hereinafter, preferred embodiments of the present invention will be described with reference to the accompanying drawings to make the present invention more clear.

Figure 1A:
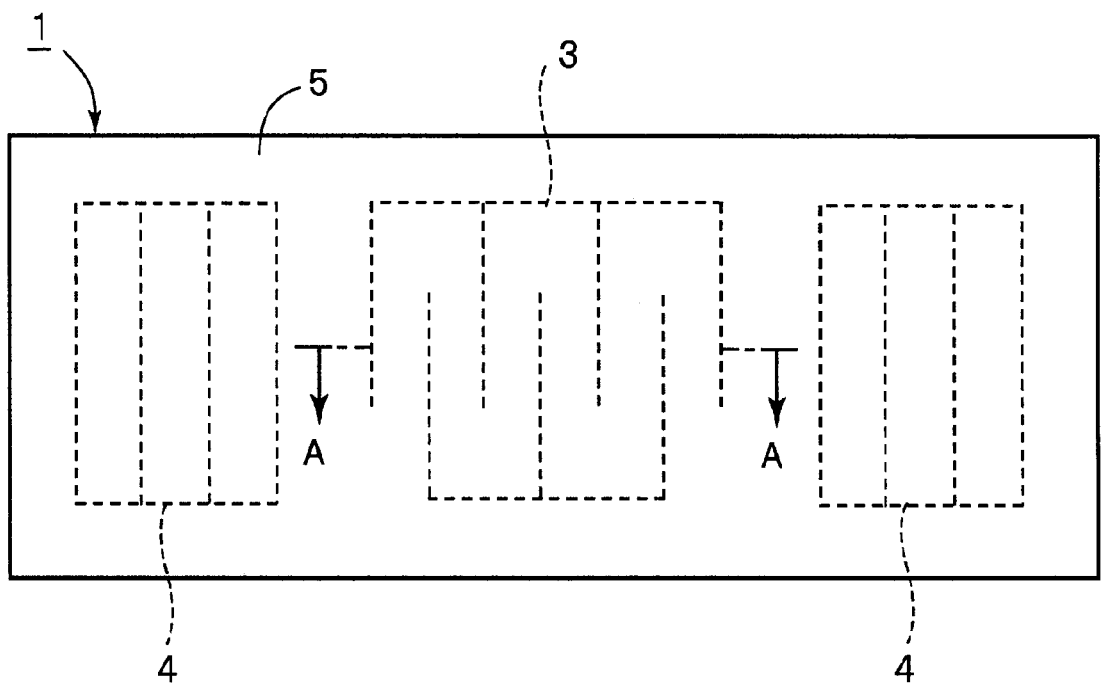
FIG. 1A is a schematic plan view of a surface acoustic wave resonator according to a preferred embodiment of the present invention.
Figure 1B:
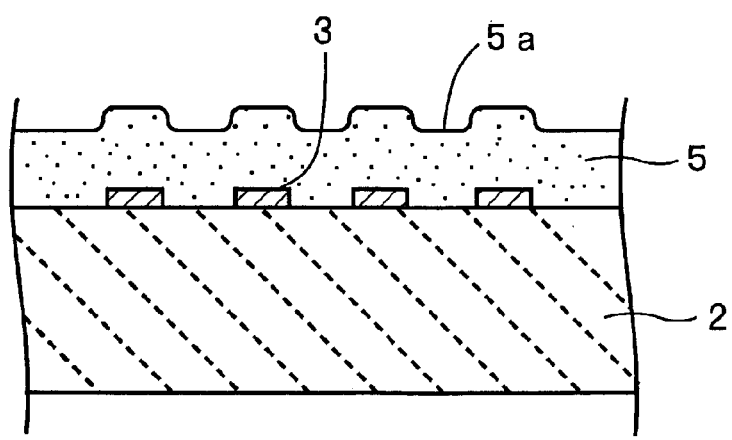
FIG. 1B is a cross-sectional view of the surface acoustic wave resonator, taken along line A-A in FIG. 1A.

FIG. 1A and FIG. 1B are a plan view showing a surface acoustic wave device according to a preferred embodiment of the present invention and a cross-sectional view thereof taken along line A-A in FIG. 1A, respectively.

The surface acoustic wave device 1 of the present preferred embodiment is preferably a one-port-type surface acoustic wave resonator having reflectors. IDT 3 and reflectors 4 and 4' are disposed on a substantially rectangular plate-shaped piezoelectric substrate 2. Insulating films 5 made of SiO2 are arranged on the piezoelectric substrate so as to cover the electrode films constituting the IDT 3 and the reflectors 4 and 4'. In this preferred embodiment, the film-thicknesses of the electrode films are preferably in the range of about 1% to about 3% of the wavelength of an excited wave. Thereby, the deterioration of the resonance characteristic and the filter characteristic can be effectively suppressed, even if the surface 5a of the SiO2 film 5 has convexities and concavities. This will be described more specifically with reference to examples below.

In known RF surface acoustic wave devices, electrode films made of Al or an Al-base alloy are formed on a piezoelectric substrate, e.g., an LiTaO3 substrate or an LiNbO3 substrate. However, the rotation-Y-cut LiTaO3 substrates or LiNbO3 substrates have problems in that their frequency-temperature coefficient TCF are high, i.e., are in the range of about −40 ppm/° C. to about −100 ppm/° C.

According to a known method which is effective in reducing the frequency-temperature coefficient TCF, an SiO2 film is arranged so as to cover electrode films disposed on a piezoelectric substrate (the above-described Patent Documents 1 to 4).

However, surface acoustic wave devices having SiO2 films disposed thereon as described above have not been made fit for practical uses as surface acoustic wave devices to be operated in RF bands. Generally, in surface acoustic wave filters for operation in RF bands and surface acoustic wave DPXs, ladder-type filters are used in which a plurality of one-port type surface acoustic wave resonators are connected in so as to define a ladder-type circuit. In these ladder-type filters, electrodes are made of Al or an Al base alloy, and the film-thicknesses of the electrodes are thick, i.e., are set at values equal to about 8% to about 10% of the wavelength of a surface acoustic wave. This is carried out to obtain a sufficient reflection characteristic and a satisfactory electromechanical coupling coefficient.

Figure 2:
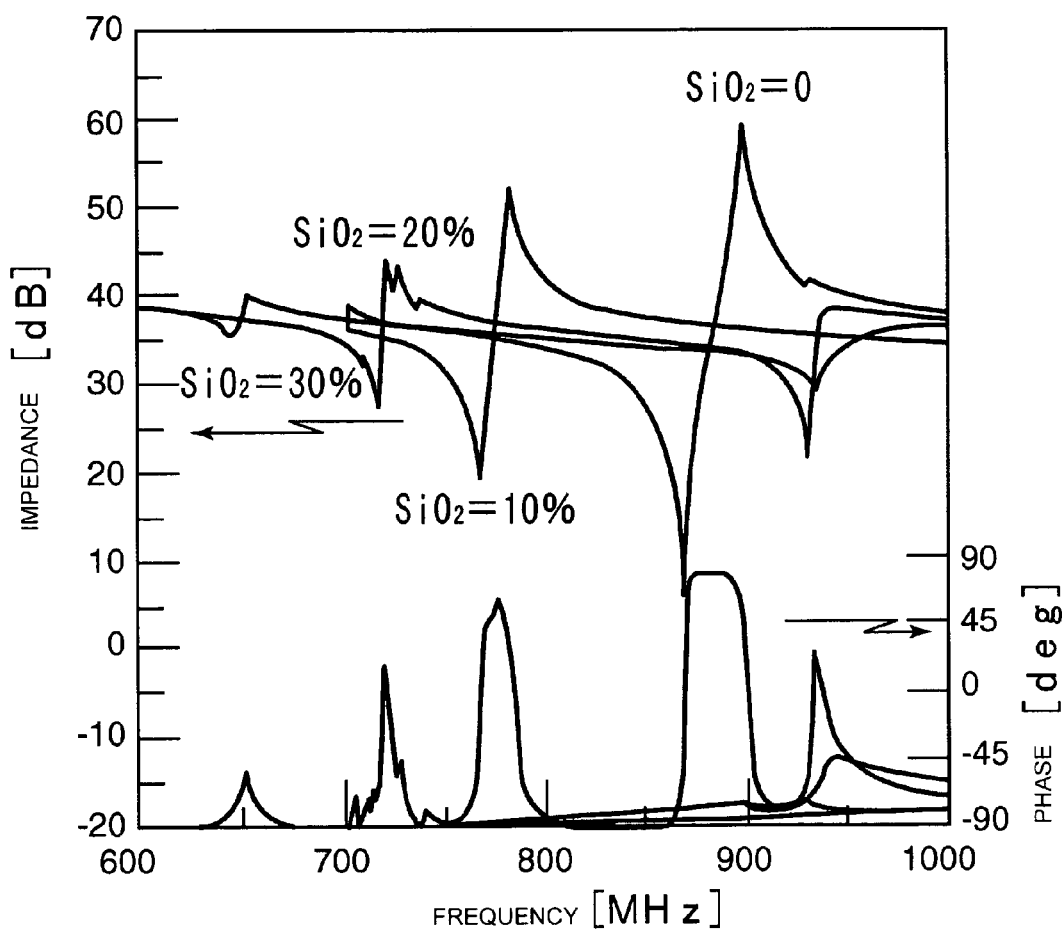
FIG. 2 is a graph showing the change of the resonance characteristics of surface acoustic wave resonators in which Al electrodes having a thickness of about 8% of the wavelength of a surface acoustic wave are formed on Y-cut X-propagation LiTaO3 substrates, and SiO2 films having different film-thicknesses are formed.

Practically, one-port type surface acoustic wave resonators having electrodes made of Al with a thickness equal to about 8% of the wavelength of a surface acoustic wave were produced, in which SiO2 films with different film-thicknesses were formed so as to cover the electrode films. Thus, the change of the characteristics was determined. FIG. 2 shows the results. The characteristics shown in FIG. 2 are those of the surface acoustic wave resonator of which the structure is schematically shown in the cross-section in FIG. 3. In particular, the surface acoustic wave resonator 11 has a structure in which IDTs 13 made of Al and one pair of reflectors (not shown) are formed on a piezoelectric substrate 12 made of a 36° Y-cut X-propagation LtTaO3. Moreover, SiO2 films 15 are arranged so as to cover the IDTs 13 and the reflectors.

As seen in FIG. 2, the formation of the SiO2 films 15 causes the resonance characteristics to be considerably deteriorated. Moreover, it is seen that the larger the thickness of the SiO2 film 15 is, the more the deterioration degree becomes.

Figure 3:
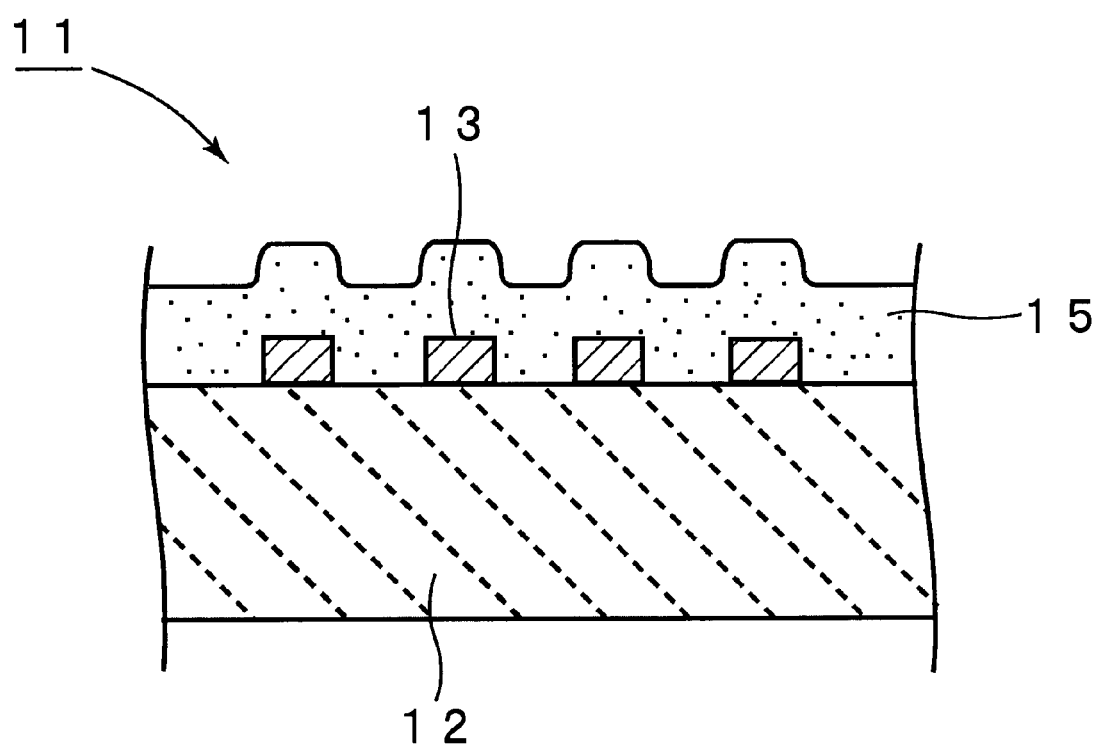
FIG. 3 is a schematic cross-sectional view of a surface acoustic wave resonator which exhibits the measurement results shown in FIG. 2.

Moreover, as seen in FIG. 3, large convex portions and concave portions are formed on the surface of the SiO2 film 15. The convex portions and concave portions are formed, since the portions of the SiO2 film existing above the IDTs and the reflectors are raised compared to the other portions of the SiO2 film.

Figure 4A:
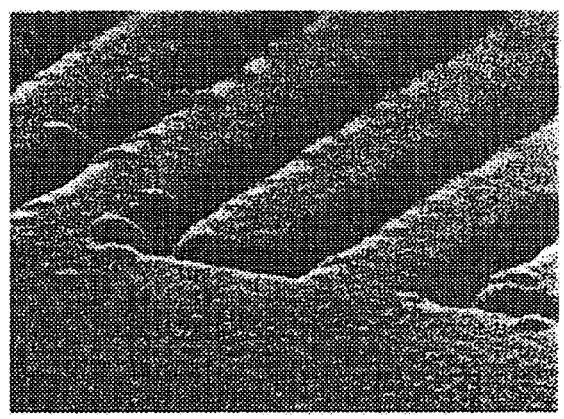
FIGS. 4A and 4B show electron microscopic photographs of the surface acoustic wave resonators exhibiting the characteristics in FIG. 2 which show the states of the surfaces of the insulating films of the resonators as an example.
Figure 4B:
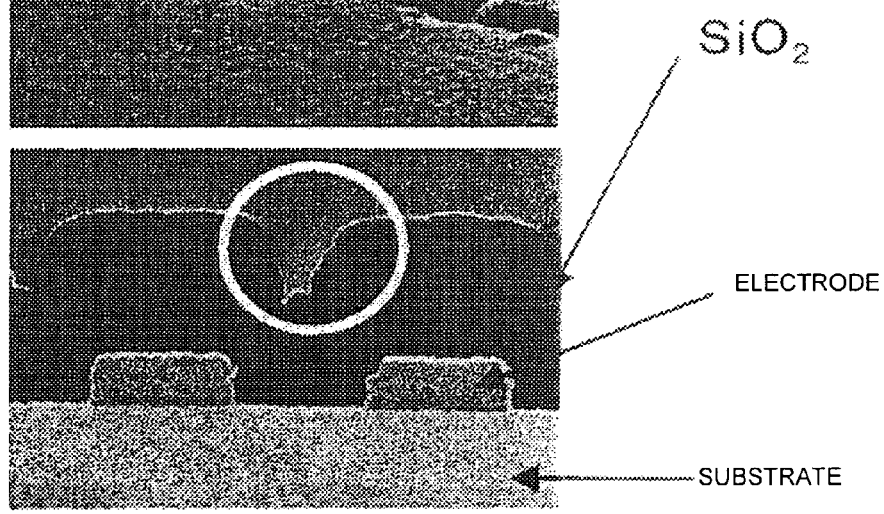

In practice, the shapes of the convex portions and concave portions are considerably different, depending on the portions of the SiO2 film, as seen the scanning electron microscopic photographs of FIG. 4A and FIG. 4B. Probably, this is because film-forming particles are jetted toward the piezoelectric substrate not only in the vertical direction but also in an oblique direction when the SiO2 film is formed. That is, the SiO2 film formed of the particles jetted in an oblique direction is grown in the oblique direction, so that the surface of the SiO2 film becomes irregular. Probably, it is very difficult to control the irregularities of the convex and concave shapes as described above.

As described above, the deterioration of the characteristic of the known surface acoustic wave resonator 11 having the SiO2 film 15 formed therein is caused by the convex portions and concave portions existing on the surface of the SiO2 film 15 and also the irregularities in the convex and concave shapes. The convex and concave shapes depend on the shapes of the electrodes and the film-thickness.

Thus, the change of the characteristics of a one-port type surface acoustic wave resonator and a ladder type filter, caused by the formation of SiO2 films, was determined. That is, the characteristics were determined before and after the formation of the SiO2 films, with the film-thickness of an electrode in the range from about 2% to about 8% of the wavelength of a surface acoustic wave and the film-thickness of the SiO2 film being in the range from about 10% to about 30% of the wavelength. The one-port type surface acoustic wave resonator used for the evaluation was formed in a manner similar to the one-port type surface acoustic wave resonator 11 shown in FIG. 3. The SiO2 film was formed by sputtering. The sputtering conditions are preferably as follows: the obtained vacuum was about $1\times10^{-5}$ Pa to about $5\times10^{-4}$ Pa; the power was about 0.5 kW to about 1.5 kW; the gas pressure was about 0.2 Pa to about 0.4 Pa; and the heating temperature was about 100° C. to about 300° C.

Figure 5:
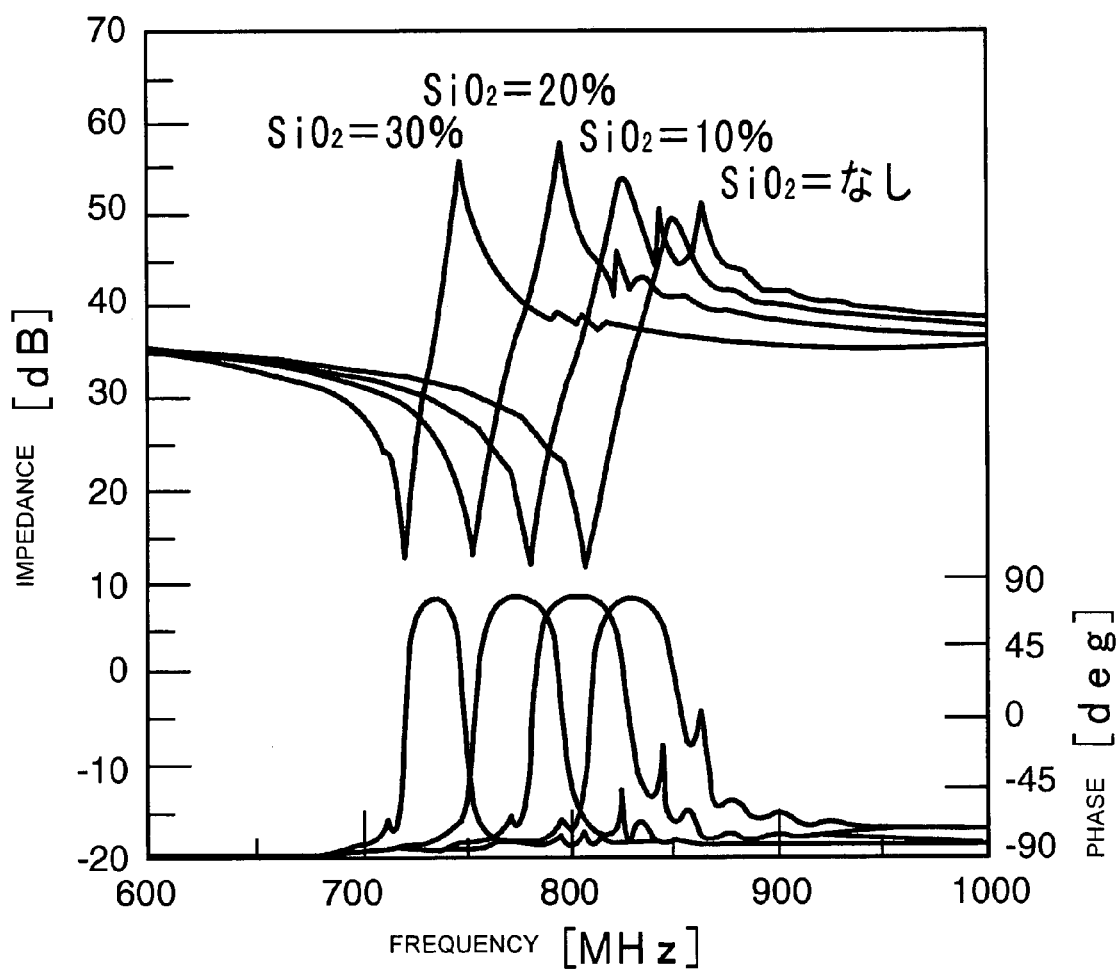
FIG. 5 is a graph showing the change of the resonance characteristics of surface acoustic wave resonators in which Al electrodes having a thickness of about 2% of the wavelength of a surface acoustic wave are formed on 36° Y-cut X-propagation LiTaO3 substrates, and SiO2 films having different film-thicknesses are formed.
Figure 6A:
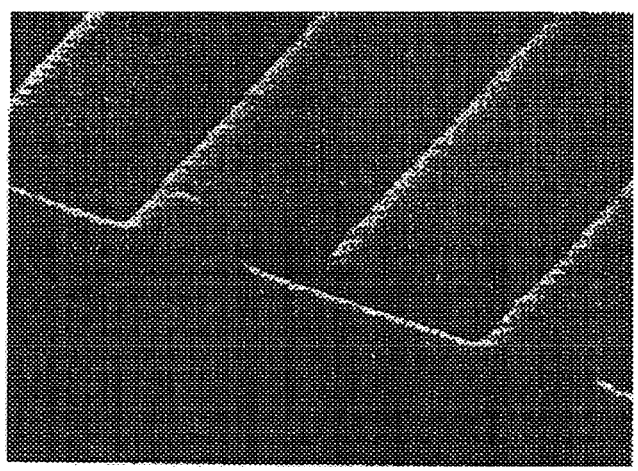
FIGS. 6A and 6B are electron microscopic photographs of surface acoustic wave resonators having the characteristics shown in FIG. 5, which show the convex portions and the concave portions on the surfaces of the SiO2 films.
Figure 6B:
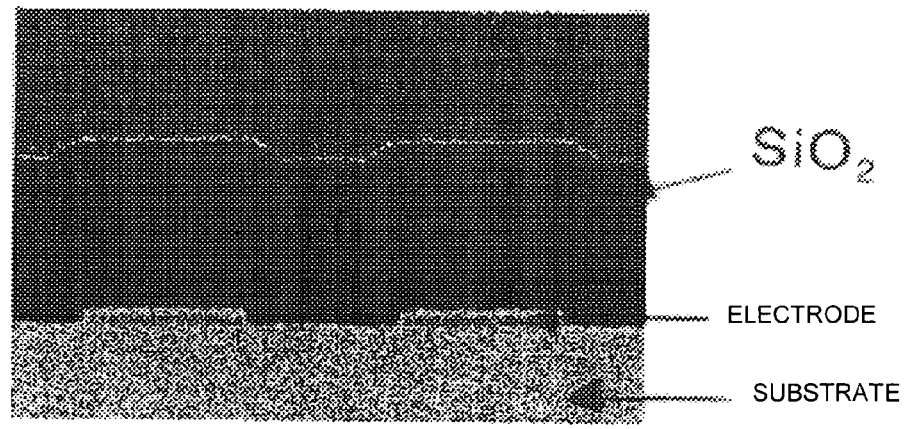

The change of the characteristic of the one-port type surface acoustic wave resonator in which the film-thickness of an electrode film made of Al is equal to about 2% of the wavelength of a surface acoustic wave, caused by the different film-thicknesses of SiO2 films, was determined. FIG. 5 shows the results. FIGS. 6A and 6B are scanning electron microscopic photographs showing the shape in cross-sections of the surface acoustic wave resonator.

As seen by comparison of FIGS. 6A and 6B to FIGS. 4A and 4B, the convex portions and concave portions on the surface of the SiO2 film are decreased correspondingly to the reduction in thickness of the Al film. However, in this case, the formation of the SiO2 film also causes the resonance characteristic to change significantly as seen in FIG. 5.

As seen by comparison of FIG. 5 to FIG. 2, when the film-thickness of the electrode film made of Al is about 2%, the ratios of the tops to the bottoms, i.e., the ratios of the anti-resonance resistances to the resonance resistances are not deteriorated, although the resonant frequencies are varied. That is, it can be seen that the resonance characteristics are superior. Probably, this is because the thickness of the electrode film is small, so that the convex portions and concave portions on the surface of the SiO2 film become small.

In addition, when the thickness of the Al electrode film is small, i.e., about 2%, no formation of the SiO2 films causes large ripples to be generated in the vicinities to the anti-resonance points. On the other hand, the formation of the SiO2 films prevents such ripples from being generated. Probably, this is due to the increase of the reflection quantity caused by the convex portions and concave portions on the film of the SiO2 films.

That is, as seen in FIG. 5, when the thickness of the Al electrode film is small, the convex portions and concave portions on the surface of the SiO2 films are reduced in size. Thereby, the deterioration of the resonance characteristic is prevented, and moreover, the SiO2 films are effective in preventing ripples from being generated in the vicinities to the anti-resonance points.

The above-described convex portions and concave portions on the surfaces of the SiO2 films mean those of which the difference between the heights of a concavity and a convexity is in the range of about 70% to about 130% of the thickness of the electrode film. Probably, the variation of the height of the surface of the insulating film in this range is due to the growth of particles jetted in an oblique direction which was made when the SiO2 films were formed by sputtering as described above.

A ladder type filter including a plurality of one-port type surface acoustic wave resonators connected so as to obtain a ladder type circuit configuration was produced based on the above-described experimental results of the one-port type surface acoustic wave resonator. The thicknesses of electrode films and the variations of insertion loss were determined. In this case, a ladder type filter was produced, in which three series-arm resonators and two parallel-arm resonators are connected so as to provide a ladder type circuit.

The IDTs and the reflectors of the ladder type filter were formed of Al.

Figure 7:
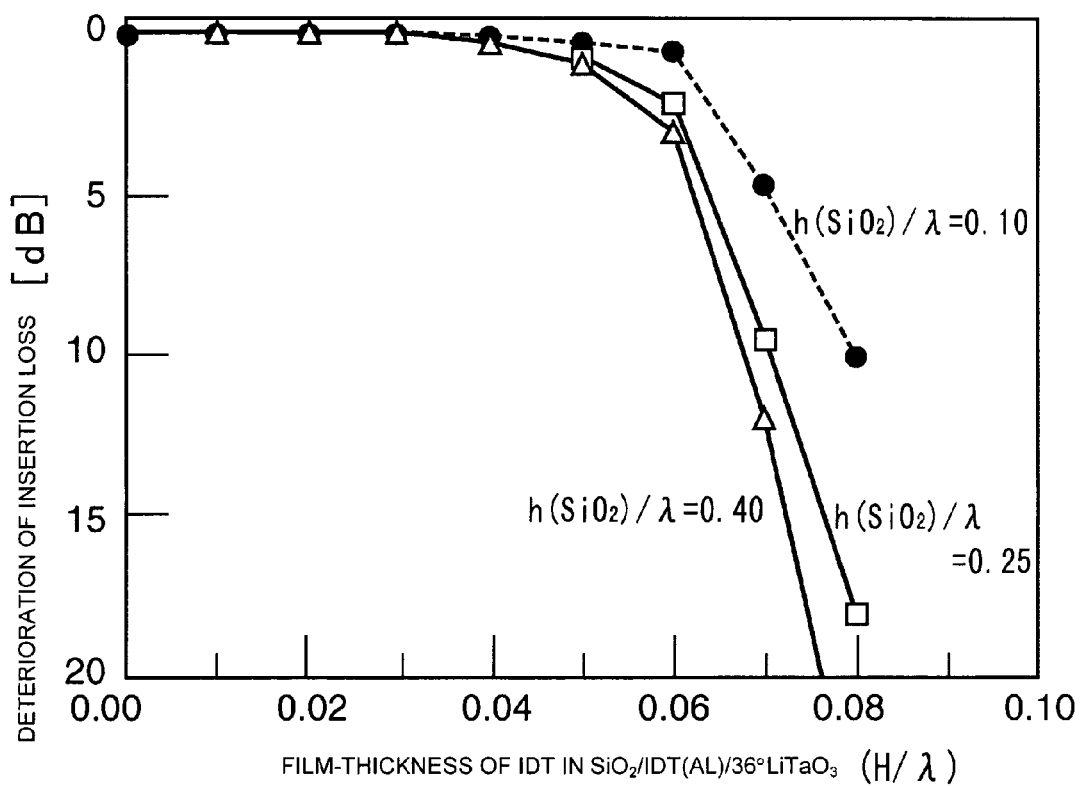
FIG. 7 is a graph showing the change of the insertion losses of ladder type filters in which the thickness of an electrode film and that of an SiO2 film are varied.

In one-port type surface acoustic wave resonators constituting the above-described series-arm resonators and the parallel-arm resonators, SiO2 films were formed so as to have thicknesses equal to about 10%, about 25%, and about 45% of the wavelength of a surface acoustic wave as in the above-described experiment. Plural types of ladder type filters were prepared by use of the one-port type surface acoustic wave resonators. FIG. 7 shows the experimental results.

As seen in FIG. 7, when the thickness of the electrode film exceeds about 4%, the insertion losses of the filters are rapidly deteriorated. Thus, desirably, the thickness of the electrode film is set at a value of up to about 4%. In particular, when an electrode is formed on a piezoelectric substrate, and an SiO2 film is formed so as to cover the electrode, convex portions and concave portions are formed on the surface of the SiO2 film as described above. However, it can be seen that the deterioration of the insertion loss of the ladder type filter can be reliably prevented by setting the thickness of the electrode film at a value of up to about 4%, preferably, at a value of up to about 3%.

In the above-described experiment, the electrode film was formed of Al. As confirmed by the inventors of the present invention, when the electrode film was formed of a heavier metal than Al such as Au, Cu, Ag, W, Ta, Pt, Mo, Ni, Co, Cr, Fe, Mn, Zn, Ti or other suitable material, results similar to those as described above were obtained.

It is known that the characteristic of such a device having a SiO2 film formed thereon can be improved by flattening the upper surface of the SiO2 film (see Patent Document 4), as described above. However, a film-forming method in which the upper surface of a SiO2 film is flattened is complicated, or a further process of flattening is required. On the other hand, according to preferred embodiments of the present invention, the SiO2 film can be easily formed by RF sputtering as described above. Thus, a complicated process is not required.

According to preferred embodiments of the present invention, a method of flattening the surface of an insulating film such as the SiO2 film or the like may be also applied, and thereby, a resonance characteristic and a filter characteristic that is even more improved can be obtained.

If the thickness of the electrode film is excessively small, the reflection per one electrode finger may become insufficient, and the resistance of an electrode finger is rapidly increased. Thus, the thickness of the electrode film is preferably set at a value of up to about 1% of the wavelength of a surface acoustic wave.

The above-described results have been obtained depending on the thickness of an electrode, the thickness of an SiO2 film formed so as to cover the electrode, and the profile of the SiO2 film on the surface thereof. Accordingly, it is not only when a 36° Y-cut X-propagation LiTaO3 substrate is used that the above-described effects can be obtained. Effects similar to those described above can be also obtained when a piezoelectric substrate having another cut-angle and being made of another material is used. This will be described more specifically with reference to FIG. 8.

Figure 8:
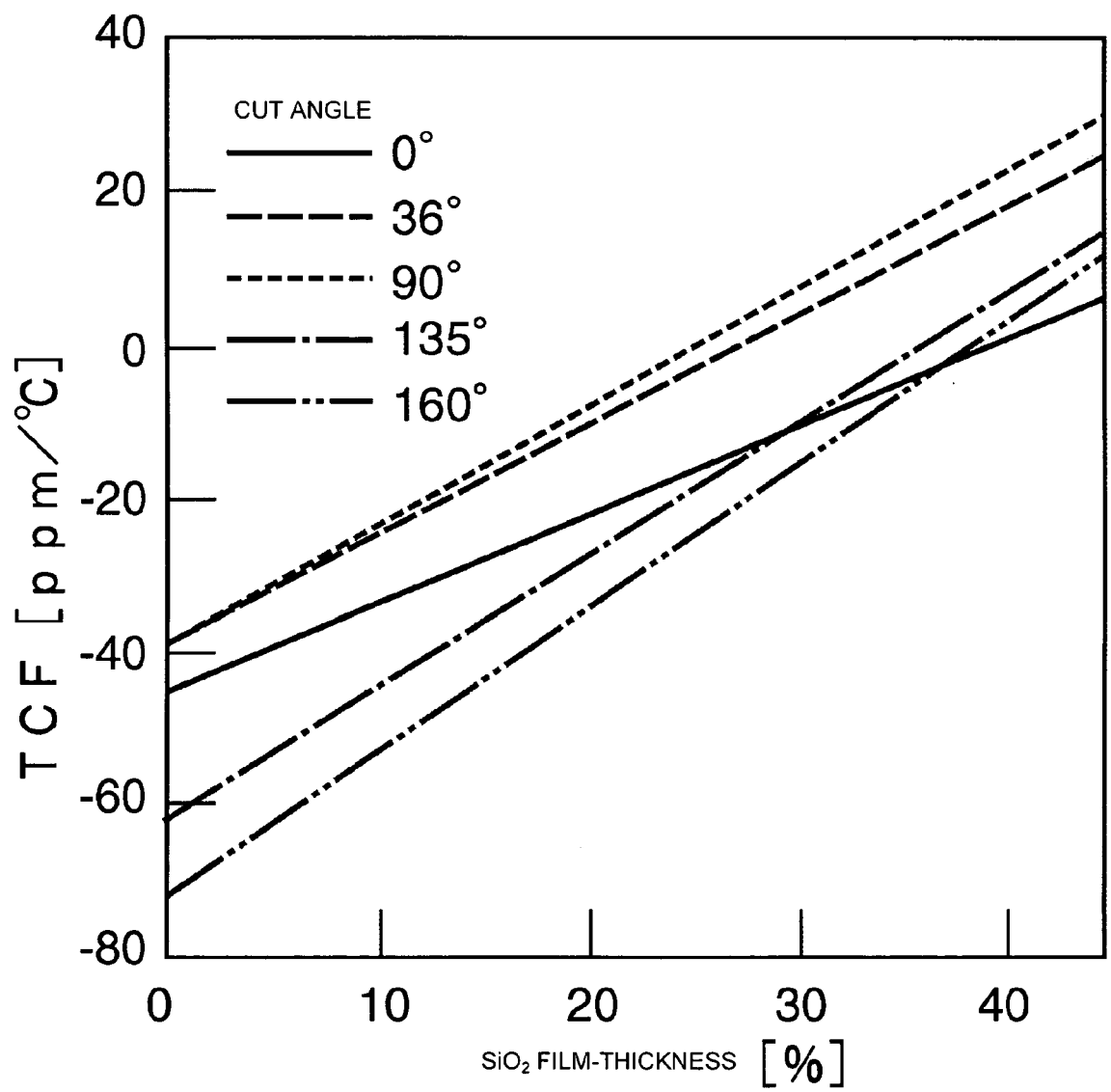
FIG. 8 is a graph showing the change of the frequency-temperature coefficient TCFs obtained when SiO2 films having different film-thicknesses are formed on LiTaO3 substrates with different cut-angles.
Figure 9:
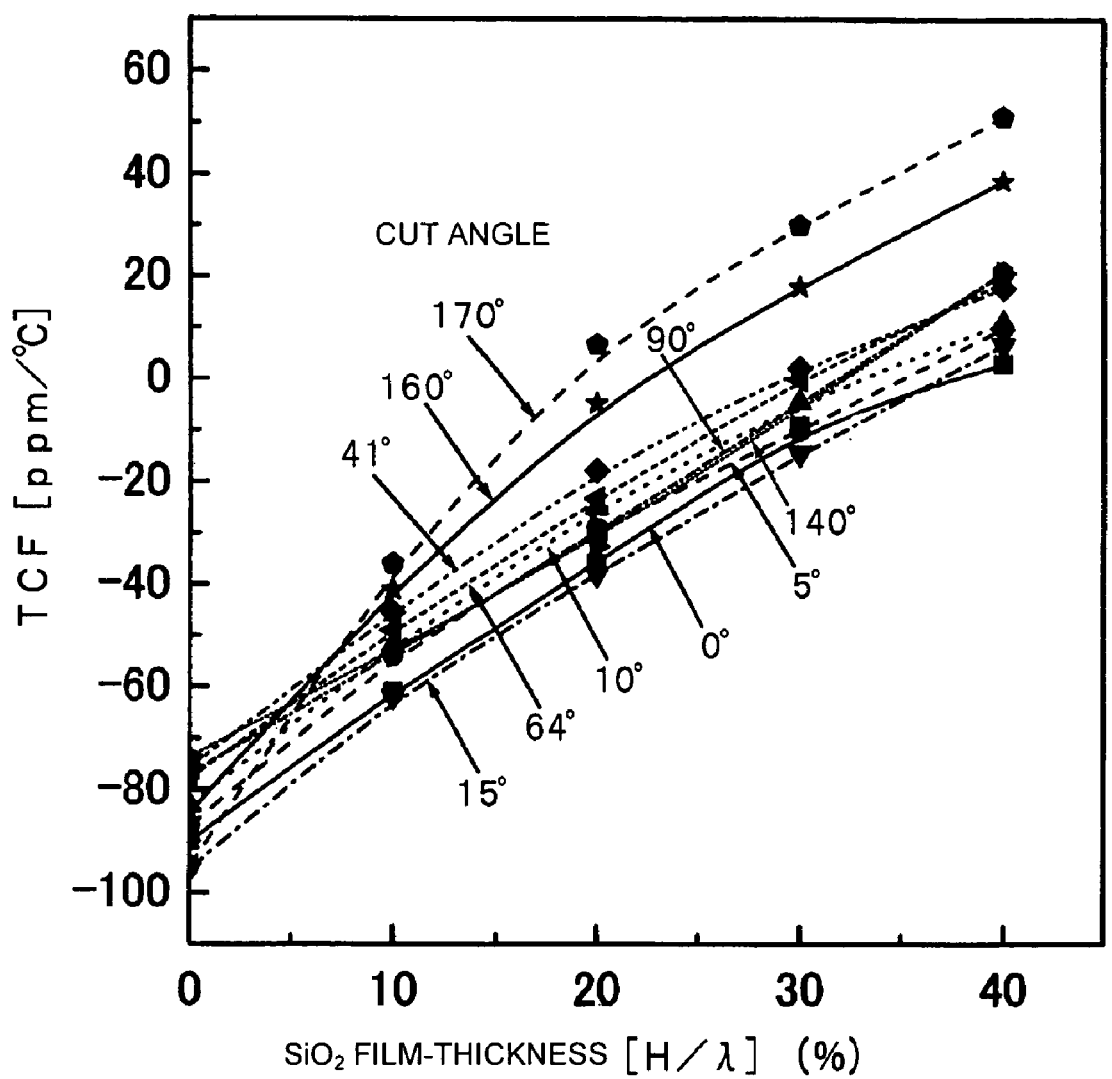
FIG. 9 is a graph showing the change of the frequency-temperature coefficient TCFs obtained when SiO2 films having different film-thicknesses are formed on LiNbO3 substrates with different cut-angles.

SiO2 films having different film-thicknesses were formed on LiTaO3 substrates having different cut-angles. Then, the relationship between the thickness of the SiO2 film and the frequency-temperature coefficient TCF was determined. FIG. 8 shows the experimental results. Moreover, SiO2 having different film-thicknesses were formed on LiNbO3 substrates. The relationship between the film-thickness of the SiO2 film and the frequency-temperature coefficient TCF was determined. FIG. 9 shows the experimental results.

As seen in FIGS. 8 and 9, the frequency-temperature coefficient TCF is linearly shifted toward the positive side with increasing of the thickness of the SiO2 film in both of the case in which the LiTaO3 substrates are used and the case in which the LiNbO3 substrates are used. Moreover, as seen in FIGS. 8 and 9, such a tendency as described above is found in the case in which the cut-angle is changed.

Thus, as seen in FIGS. 8 and 9, the frequency-temperature coefficient TCF can be decreased to one half of that obtained when no SiO2 is formed, by setting the thickness of the SiO2 film at a value in the range of about 15% to about 40% of the wavelength of a surface acoustic wave. Moreover, preferably, the frequency-temperature coefficient TCF can be reduced substantially to zero by setting the thickness of the SiO2 film at a value of at least about 30% of the wavelength of a surface acoustic wave. Furthermore, preferably, the frequency-temperature coefficient TCF can be reduced substantially to zero by using LiNbO3 substrates and LiTaO3 substrates having cut-angles of about 0 to about 160°.

It is to be noted that the frequency-temperature coefficient TCF scarcely changes when the thickness of the electrode film is varied. Accordingly, as seen in FIG. 7, a frequency-temperature coefficient TCF can be even more improved while the insertion loss and the resonance characteristic are deteriorated, by setting the thickness of the SiO2 film at a value in the range of about 15% to about 40% of the wavelength of a surface acoustic wave in the configuration of such a device in which the thickness of the electrode film is in the range of about 1% to about 4% of the wavelength of the surface acoustic wave.

In preferred embodiments of the present invention, the type of surface acoustic wave used is not especially limited. Preferably, a Love wave, which is known as a surface acoustic wave to be propagated on a rotation Y-cut X-propagation LiNbO3 substrate, is used. When a Love wave is propagated, substantially no attenuation is generated. Thus, a resonance characteristic and also a filter characteristic more improved can be obtained. To generate a Love wave as an excited surface acoustic wave, the mass-addition is required in general. Thus, desirably, an electrode is formed of a metal of which the specific gravity is higher than Al.

Figure 10:
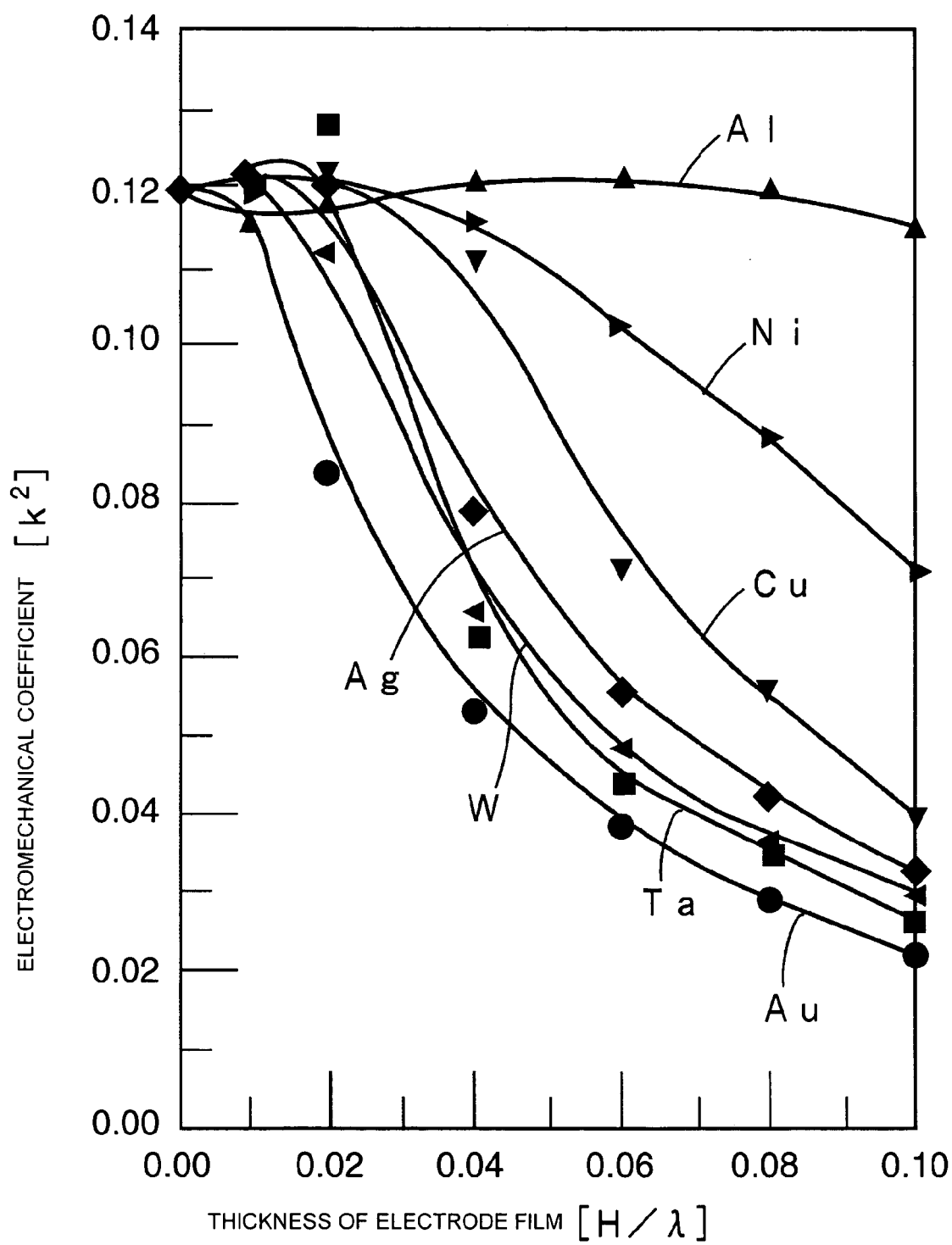
FIG. 10 is a graph showing the relationships between the film-thicknesses of electrodes of a metal heavier than Al and the electromechanical coupling coefficients of leaky surface acoustic waves obtained when the electrodes made of a metal heavier than Al and having different film-thicknesses are formed on LiNbO3 substrates having an Euler's angle (0, 154.0, 0)
Figure 11:
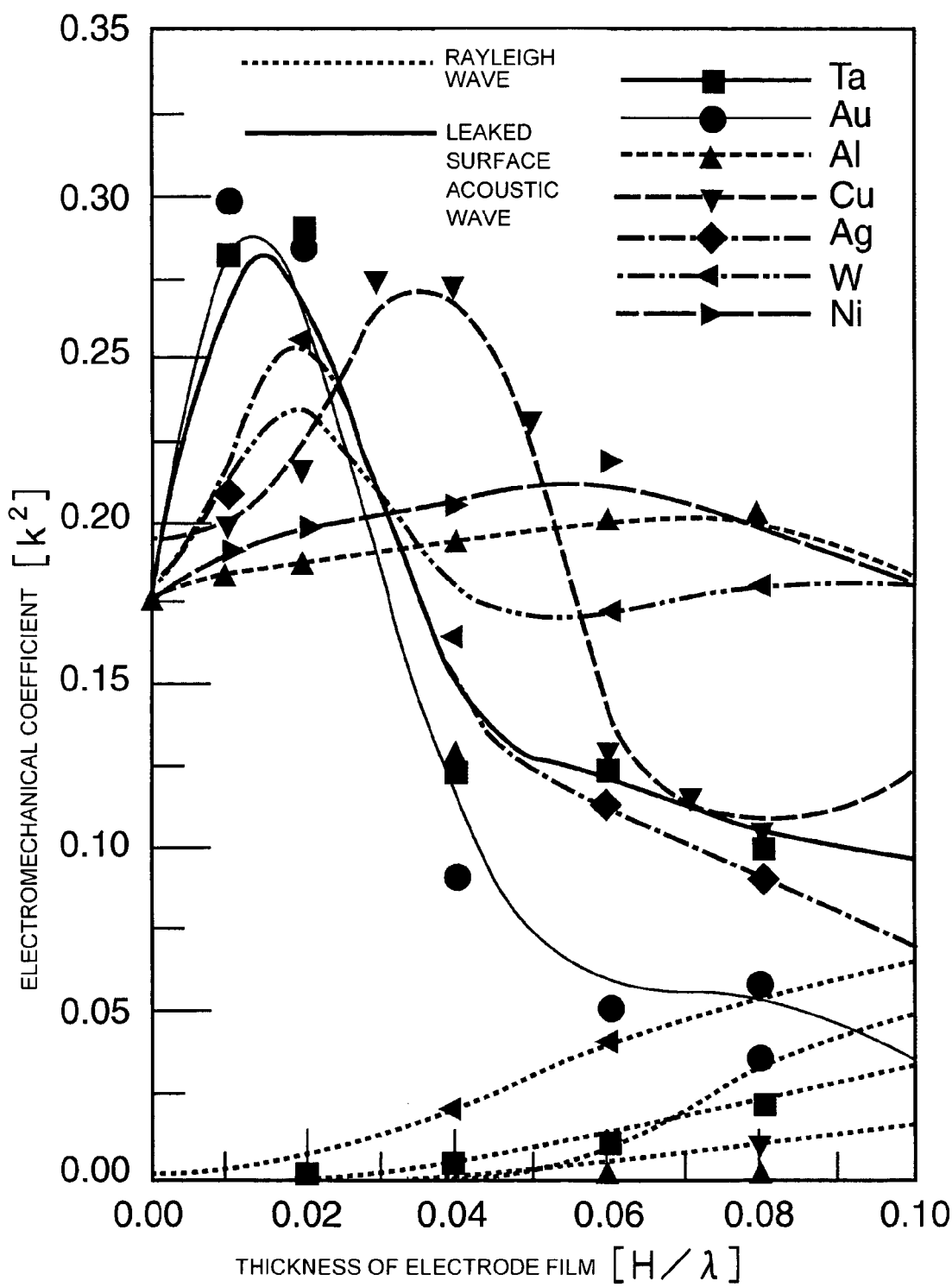
FIG. 11 is a graph showing the relationships between the film-thicknesses of electrodes and the electromechanical coupling coefficients of Rayleigh waves and leaky surface acoustic waves obtained when the electrodes made of a metal heavier than Al and having different film-thicknesses are formed on LiNbO3 substrates having an Euler's angle (0, 131.0, 0)

Then, electrodes made of different metals were formed on rotation Y-cut X-propagation LiNbO3 substrates. Moreover, SiO2 films were formed on the surfaces. The relationship between the thickness of the electrode film and the electromechanical coupling coefficient was determined. FIGS. 10 and 11 show the measurement results.

In the measurement of which the results are shown in FIG. 10, an LiNbO3 substrate with an Euler's angle (0,154, 0) was used. A leaky surface acoustic wave (LSAW) was used as a thin surface acoustic wave. In the measurement of which the results are shown in FIG. 11, a Rayleigh wave which is propagated on a LiNbO3 substrate with an Euler's angle (0,131, 0) and moreover, a leak surface acoustic wave were used.

As seen in FIGS. 10 and 11, when the electrode film is formed of a metal heavier than Al, the electromechanical coupling coefficient has a maximum in the region of the film-thickness which is smaller than about 6% of the wavelength of the surface acoustic wave, more specifically, in the region of the film-thickness which is smaller than about 4% of the wavelength, and thus, has a large electromechanical coupling coefficient compared to a known electrode made of Al. Moreover, it is seen that for an electrode made of a metal heavier than Al, the change of the electromechanical coupling coefficient with the film-thickness is larger than that for the Al electrode.

Generally, desirably, the electromechanical coupling coefficient has a value suitable for a desired filter-bandwidth. As described above, when a metal heavier than Al is used, the adjustable range of the electromechanical coupling coefficient is wide, so that an electromechanical coupling coefficient corresponding to a desired bandwidth can be easily obtained.

In the description above, an SiO2 film is preferably used as the insulating film. Piezoelectric substrates made of Ta2O3 and ZnO may be used to improve the temperature characteristic, enhance the piezoelectric property, and protect the surface of a device. In this case, according to preferred embodiments of the present invention, deterioration of the resonance characteristics, the filter-characteristics, and so forth can be prevented as in the above-described examples, while the piezoelectric property can be improved, and the surface-protection effect can be enhanced. Also, the deterioration of the characteristics of such a device, which is caused by the formation of the insulating film made of a piezoelectric film or the like, can be prevented by setting the thickness of the electrode film at a value in the range of about 1% to about 3%.

In the case in which electrodes of Al are formed on a piezoelectric substrate to form a one-port type surface acoustic wave resonator, and an SiO2 film is arranged so as to cover the electrode films, as shown in FIG. 4B, large convex portions and concave portions tend to be formed on the surface of the SiO2 film, caused by the formation of the electrodes for the IDTs and the reflectors. Such convex portions and concave portions can be reduced in size by selection of an appropriate method of forming an SiO2 film. This will be described with reference to FIGS. 12 to 14.

Figure 12:
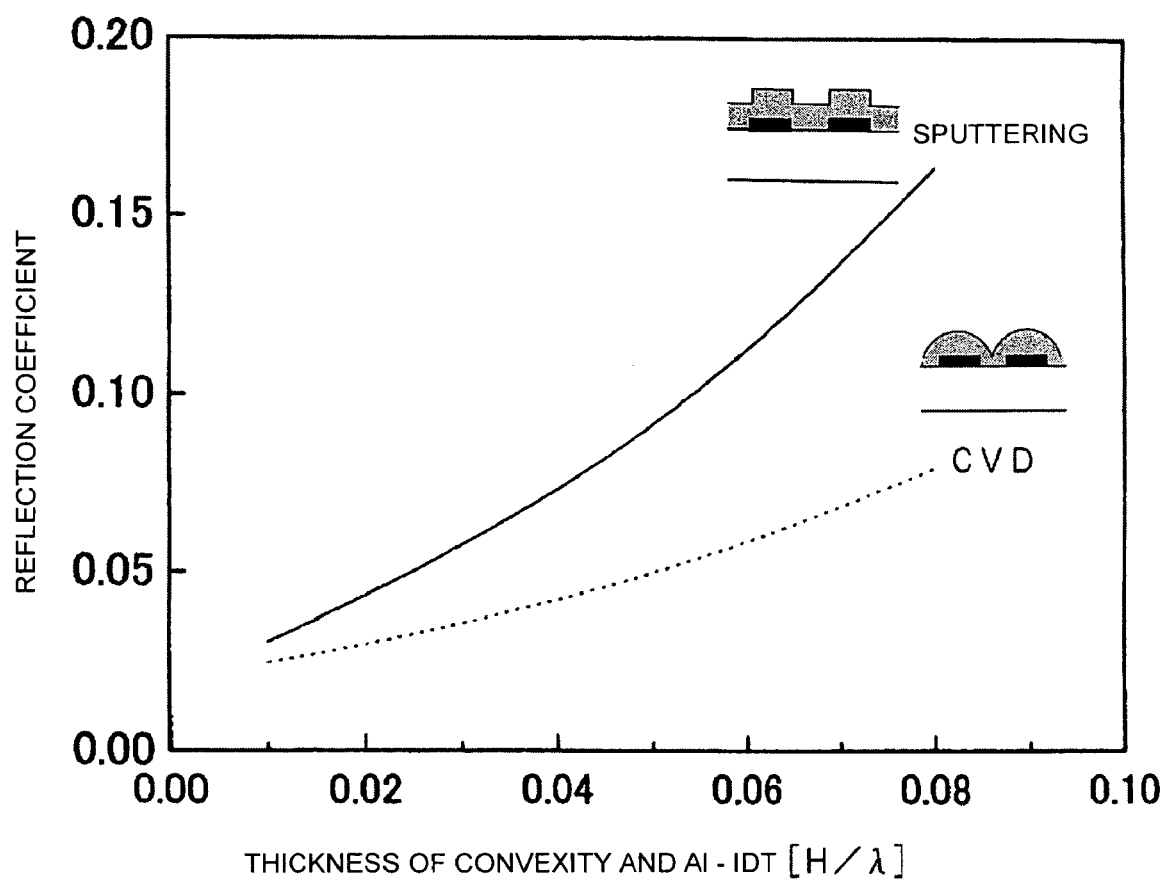
FIG. 12 is a graph showing the relationships between the thickness of IDTs and the reflection coefficients obtained when the IDTs made of Al and having different thicknesses are formed on 36° Y-cut X-propagation LiTaO3 substrates, and SiO2 films having a film-thickness of about 20% of the wavelength are formed by sputtering and CVD.

Interdigital electrodes of Al having different film-thicknesses were formed on 36° Y-cut X-propagation LiTaO3 substrates, and SiO2 films having a film-thickness of about 0.2λ were formed thereon by sputtering and by CVD. The change of the reflection coefficients caused by the formation of the SiO2 films was measured. FIG. 12 shows the measurement results.

As seen in FIG. 12, when the thicknesses of the IDTs made of Al are increased, that is, the heights of the convex portions formed on the surfaces of the SiO2 films are increased, the reflection coefficients become large. For the SiO2 film formed by CVD, the reflection coefficient is smaller that that for the SiO2 film formed by sputtering. A probable reason for this is as follows. When the SiO2 is formed by sputtering, the surface of the SiO2 film has convex portions and concave portions which substantially conform to the convex portions and concave portions formed by the presence of the electrodes. On the other hand, when the SiO2 film is formed by CVD, the surface of the SiO2 film has curved portions which are formed due to the upward projection of the electrodes present under the curved portions. Thus, the surface of the SiO2 film becomes curved between the convex portions at the surface of the SiO2 film. Hence, the difference in height between the concave portions and convex portions becomes small.

Figure 13A:
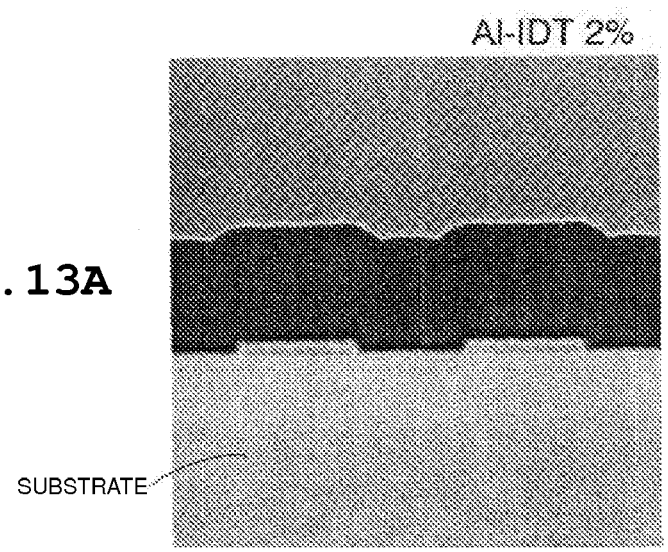
FIGS. 13A, 13B, and 13C are electron microscopic photographs of structures in which IDTs made of Al and having film-thicknesses of about 0.02λ, about 0.04λ, and about 0.08λ are formed on 36° Y-cut X-propagation LiTaO3 substrates, and an SiO2 film having a thickness of about 30% of the wavelength is formed thereon by sputtering.
Figure 13B:
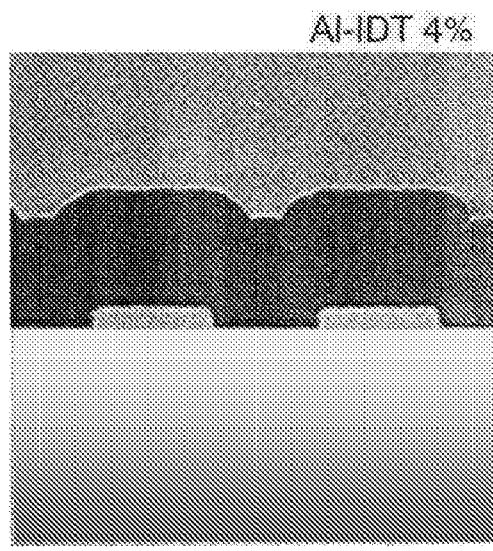
Figure 13C:
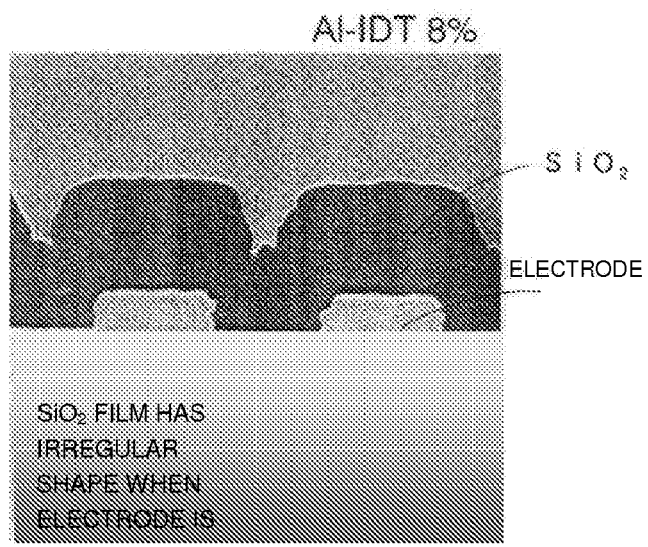

IDTs of Al having thicknesses of about 0.02λ, about 0.04λ, and about 0.08λ were formed on LiTaO3 substrates, and SiO2 films having a thickness of about 0.3λ were formed. Thus, surface acoustic wave resonators were formed. FIGS. 13A, 13B, and 13C show the electron microscopic photographs showing the cross-sectional structures of the surface acoustic wave resonators. Moreover, IDT of Al having a thickness of about 0.1λ was formed, and an SiO2 film having a thickness of about 0.3λ (λ represent the wavelength) was formed. Thus, a surface acoustic wave resonator was formed. FIG. 14 shows an electron microscopic photograph showing the cross-sectional structure of the surface acoustic wave resonator.

As seen by the comparison of FIGS. 13A, 13B, and 13C with FIG. 14, in the case of the SiO2 films formed by CVD, the difference in height between the convex portions and the concave portions on the surface of the SiO2 films is small compared to the SiO2 films formed by sputtering.

The present invention is not limited to each of the above-described preferred embodiments, and various modifications are possible within the range described in the claims. an embodiment obtained by appropriately combining technical features disclosed in each of the different preferred embodiments is included in the technical scope of the present invention.

What is claimed is:

1. A surface acoustic wave device comprising:
    a piezoelectric substrate;
    electrode films disposed on the piezoelectric substrate and constituting at least one IDT; and
    a sputtered insulating film arranged on the piezoelectric substrate so as to cover the electrode films and the insulating film having convex portions and concave portions on an upper surface thereof; wherein
    a film-thickness of the electrode films is in the range of about 1% to about 2.5% of the wavelength of an excited surface acoustic wave;
    the piezoelectric substrate is a rotation Y-cut X-propagation $LiNbO_3$ substrate;
    the surface acoustic wave is a Love wave; and
    the $LiNbO_3$ substrate has a cut-angle which is in the range of about 0° to about 160°.

2. A surface acoustic wave device according to claim 1, wherein the insulating film is made of $SiO_2$.

3. A surface acoustic wave device according to claim 2, wherein the film-thickness of the insulating film made of $SiO_2$ is in the range of about 15% to about 40% of the wavelength of the surface acoustic wave.

4. A surface acoustic wave device according to claim 2, wherein the film-thickness of the insulating film made of $SiO_2$ is at least about 30% of the wavelength of the surface acoustic wave.

5. A surface acoustic wave device according to claim 1, wherein the piezoelectric substrate has a frequency-temperature coefficient TCF which is in the range of about −100 ppm/°C. to about −10 ppm/°C.

6. A surface acoustic wave device according to claim 1, further comprising a reflector defined by the electrode films.

7. A surface acoustic wave device according to claim 1, wherein the electrode films are made of a metal or an alloy having a higher density than Al.

8. A surface acoustic wave device according to claim 1, wherein the surface acoustic wave device is a one-port type surface acoustic wave resonator.

9. A surface acoustic wave device according to claim 1, wherein the surface acoustic wave device is a resonator type filter, a ladder type filter, or a lattice type filter.

* * * * *